(12) United States Patent  
Furihata

(10) Patent No.: US 7,268,416 B2  
(45) Date of Patent: Sep. 11, 2007

(54) MOUNTING STRUCTURE, ELECTRO-OPTICAL DEVICE, SUBSTRATE FOR ELECTRO-OPTICAL DEVICE, AND ELECTRONIC APPARATUS

(75) Inventor: Hiroaki Furihata, Matsumoto (JP)

(73) Assignee: Seiko Epson Corporation (JP)

( * ) Notice: Subject to any disclaimer, the term of this patent is extended or adjusted under 35 U.S.C. 154(b) by 320 days.

(21) Appl. No.: 11/124,578

(22) Filed: May 5, 2005

(65) Prior Publication Data

US 2005/0248012 A1    Nov. 10, 2005

(30) Foreign Application Priority Data

May 7, 2004    (JP)    ............................. 2004-138556  
Mar. 30, 2005    (JP)    ............................. 2005-100110

(51) Int. Cl.
*H01L 23/02*    (2006.01)
*H01L 23/001*   (2006.01)
*H01L 23/194*   (2006.01)
*H01L 21/53*    (2006.01)

(52) U.S. Cl. .................... 257/678; 257/48; 257/84; 257/88; 257/91; 257/93; 257/99

(58) Field of Classification Search ........ 257/678–733, 257/787–796, 48, 84, 88, 91, 93, 99  
See application file for complete search history.

(56) References Cited

U.S. PATENT DOCUMENTS 4,643,526 A * 2/1987 Watanabe et al. ........... 349/151

4,955,695 A * 9/1990 Kubo et al. .................. 349/151  
5,608,559 A * 3/1997 Inada et al. .................. 349/149

FOREIGN PATENT DOCUMENTS

JP    2003-036039    2/2003

* cited by examiner

*Primary Examiner*—Wai-Sing Louie  
*Assistant Examiner*—Marc-Anthony Armand  
(74) *Attorney, Agent, or Firm*—Harness, Dickey & Pierce, P.L.C.

(57) ABSTRACT

A mounting structure includes a mounting substrate on which a plurality of mounting pads each constituting a portion of a conductive pattern extending in a Y direction are arranged in an X direction, the X direction and the Y direction being two directions orthogonal to each other, and a member that is mounted on the mounting substrate so as to be electrically connected to the mounting pads. In the mounting structure, a first conductive layer, an insulating layer, a second conductive layer, and a third conductive layer are formed on the mounting substrate in this order from a lower side to an upper side. In addition, each conductive pattern includes the mounting pad that has a three-layered structure formed by laminating the first conductive layer, the insulating layer, and the third conductive layer, which is an outermost layer, in this order, a test pad that is positioned adjacent to a region where the mounting pad is formed, outside a region where the member is mounted, and that has the three-layered structure formed by laminating the first conductive layer, the insulating layer, and the third conductive layer, which is the outermost layer, in this order, and a lead portion that extends from the test pad, and that has a two-layered structure of the first conductive layer and the insulating layer, which is an outermost layer.

23 Claims, 10 Drawing Sheets

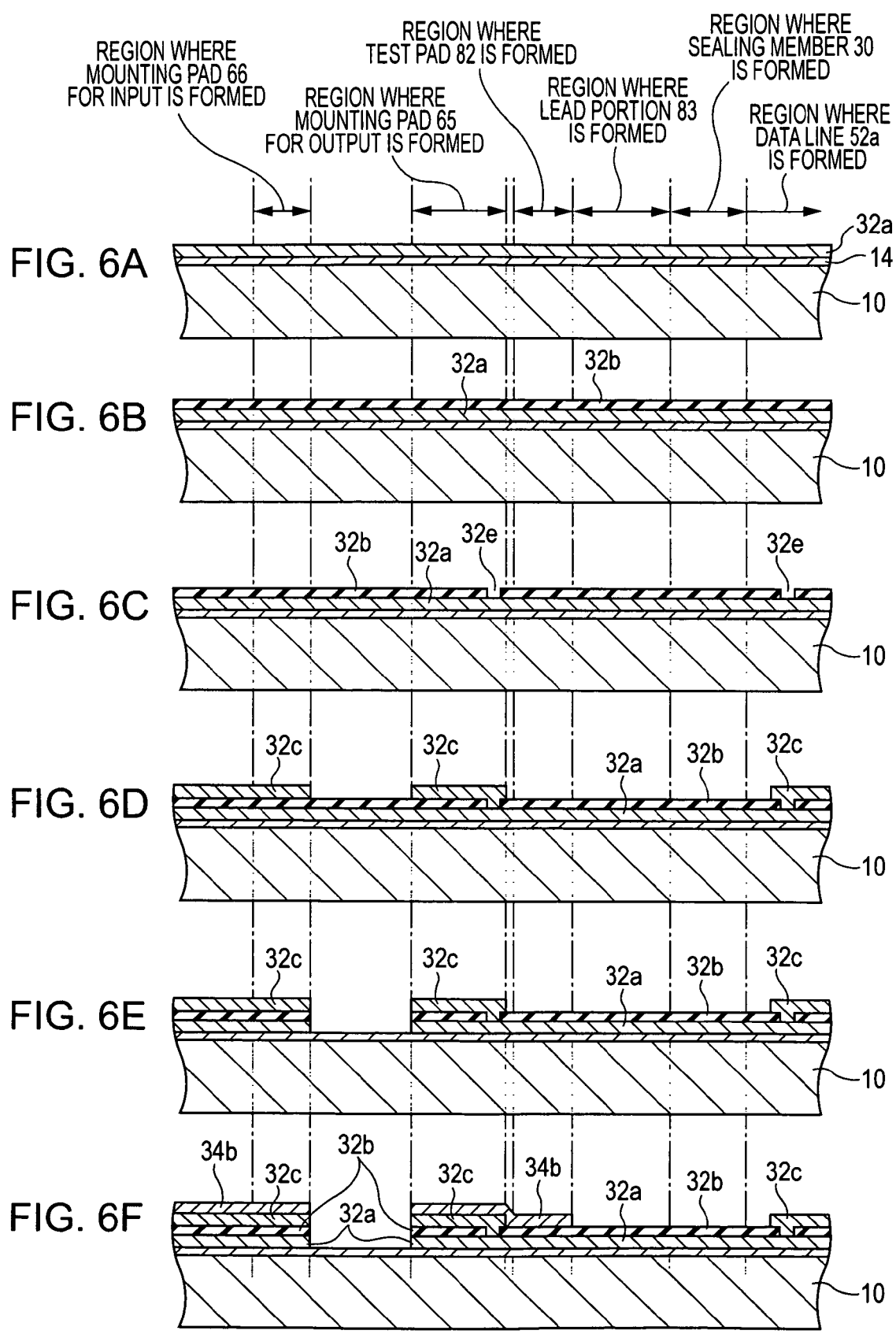

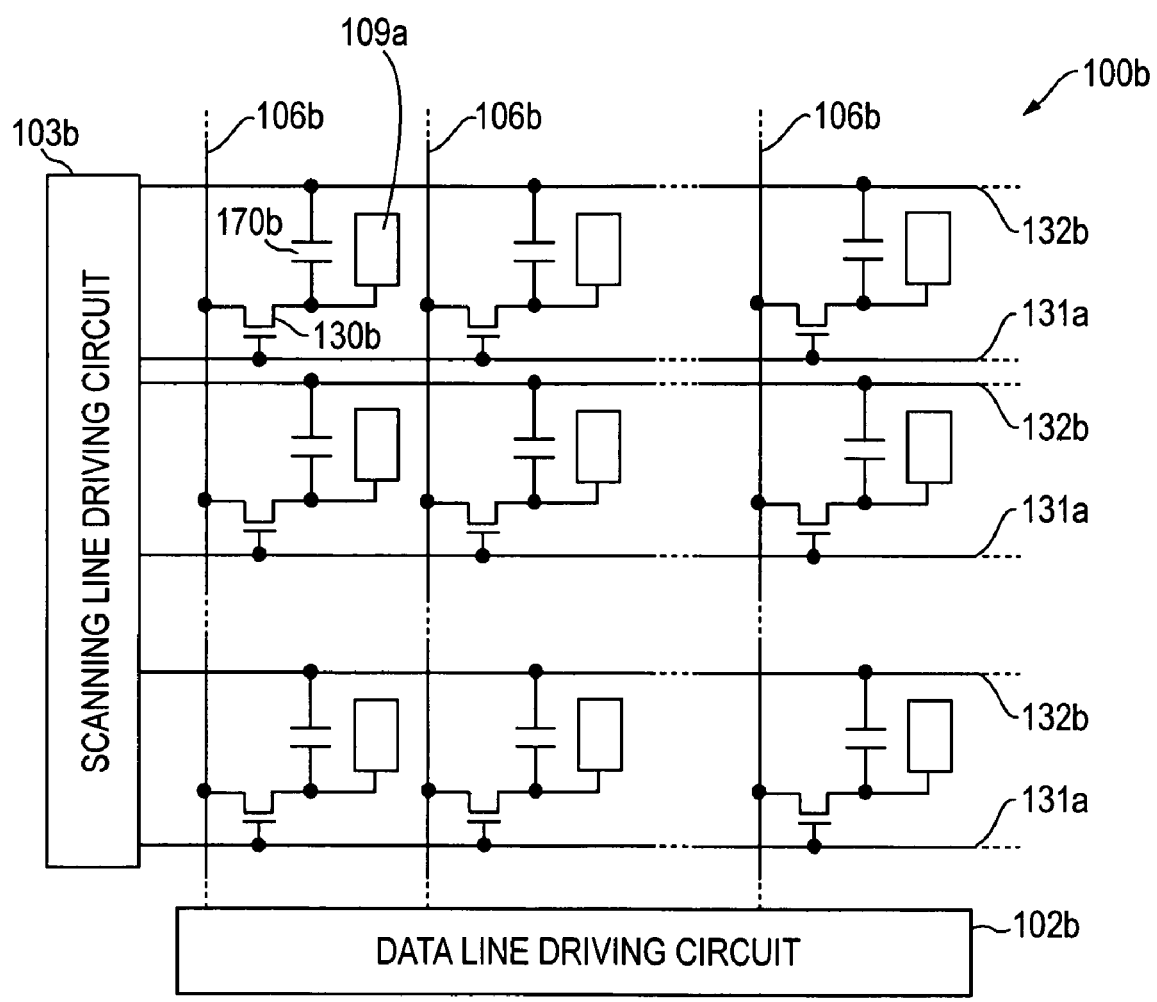

MOUNTING STRUCTURE, ELECTRO-OPTICAL DEVICE, SUBSTRATE FOR ELECTRO-OPTICAL DEVICE, AND ELECTRONIC APPARATUS

BACKGROUND OF THE INVENTION

1. Technical Field

The present invention relates to a mounting structure in which a member, such as an IC, is mounted on a mounting body, such as a substrate, an electro-optical device having the mounting structure, an electro-optical device substrate, and an electronic apparatus having the electro-optical device.

2. Related Art

In electro-optical devices, such as active matrix liquid crystal devices and organic electroluminescent display devices, in general, pixels are provided corresponding to intersections of a plurality of data lines and a plurality of scanning lines, and predetermined signals are supplied to the respective pixels through the data lines and the scanning lines to drive the pixels. Therefore, in the electro-optical devices, a plurality of conductive patterns are formed as signal lines on an electro-optical device substrate having an electro-optical material thereon, and an IC is mounted on the electro-optical device substrate in a COG (Chip On Glass) manner through mounting pads each constituting a portion of the signal lines. In addition, a flexible substrate on which an IC is mounted in a COF manner (Chip On Film) is mounted on the mounting pads of the electro-optical device substrate.

In the electro-optical device, with an increase in the number of pixels or a reduction in pitch between pixels, the pitch of conductive patterns tends to decrease. Therefore, when, for example, water is permeated into the conductive patterns exposed to air, corrosion occurs in the conductive patterns, which causes the conductive patterns to become broken. Therefore, in order to solve the problem of the corrosion occurring in the conductive patterns, there has been proposed a technique of covering the exposed conductive patterns with resin (for example, see Japanese Unexamined Patent Application Publication No. 2003-36039).

Further, in the electro-optical device, before an IC is mounted on the electro-optical device substrate, a test probe comes into contact with the conductive patterns to apply test signals to each pixel, thereby testing the operation of each pixel. Therefore, in the related art, the conductive patterns extend from the mounting pads to a region overlapping the IC in plan view, and the extending portions are used as test pads with which the test probe comes into contact.

However, as disclosed in Japanese Patent Application Publication No. 2003-36039, in a method of covering the conductive patterns with resin, since the resin is coated with low precision, there is a fear that, when the conductive patterns are coated with the resin layer, mounting pads will also be covered with the resin layer. In addition, as in the related art, in a structure in which the test pads are arranged so as to overlap the IC in plan view, when the IC is formed in a small size, it is difficult to accurately mount the test pads.

SUMMARY

An advantage of the invention is that it provides a mounting structure, an electro-optical device, an electro-optical device substrate, and an electronic apparatus capable of bringing a test probe into contact with test pads even if a member to be mounted, such as an IC, has a small size.

Therefore, according to an aspect of the invention, when two directions orthogonal to each other are the X direction and the Y direction, a mounting structure includes a mounting substrate on which a plurality of mounting pads each constituting a portion of a conductive pattern extending in the Y direction are arranged in the X direction, and a member that is mounted on the mounting substrate so as to be electrically connected to the mounting pads. In the mounting structure, a first conductive layer, an insulating layer, a second conductive layer, and a third conductive layer are formed on the mounting substrate in this order from a lower side to an upper side. In addition, each conductive pattern includes the mounting pad that has a three-layered structure formed by laminating the first conductive layer, the insulating layer, and the third conductive layer, which is an outermost layer, in this order; a test pad that is positioned adjacent to a region where the mounting pad is formed, outside a region where the member is mounted, and that has the three-layered structure formed by laminating the first conductive layer, the insulating layer, and the third conductive layer, which is the outermost layer, in this order; and a lead portion that extends from the test pad, and that has a two-layered structure of the first conductive layer and the insulating layer, which is an outermost layer.

Further, according to another aspect of the invention, when two directions orthogonal to each other are the X direction and the Y direction, a mounting structure includes a mounting substrate on which a plurality of mounting pads each constituting a portion of a conductive pattern extending in the Y direction are arranged in the X direction, and a member that is mounted on the mounting substrate so as to be electrically connected to the mounting pads. In the mounting structure, each conductive pattern includes the mounting pad that has a three-layered structure formed by laminating a first conductive layer, an insulating layer, and an ITO layer, which is an outermost layer, in this order; a test pad that is positioned adjacent to a region where the mounting pad is formed, outside a region where the member is mounted, and that has the three-layered structure formed by laminating the first conductive layer, the insulating layer, and the ITO layer, which is the outermost layer, in this order; and a lead portion that extends from the test pad, and that has a two-layered structure of the first conductive layer and the insulating layer, which is an outermost layer.

According to this structure, since the conductive patterns each are formed by laminating the first conductive layer, the insulating layer, and the third conductive layer in this order in regions other than the region where the member is mounted to overlap the mounting substrate in plan view, it is possible to form the test pad in the conductive pattern such that a test probe can come into contact with the test pad, even if the member to be mounted has a small size. In addition, the lead portion of the conductive pattern has a two-layered structure of the first conductive layer and the insulating layer. Therefore, when air or water is permeated into portions where the lead portions are closer to each other, corrosion does not occur therein since the lead portions are covered with the insulating layer, which is an outermost layer. Further, the two-layered structure is formed by patterning the second conductive layer and the third conductive layer formed on the insulting layer. Therefore, according to this patterning, it is possible to form the two-layered structure in a predetermined region with high precision, unlike a resin coating method. Thus, even if the insulating layer is formed as the outermost layer of the lead portion at a position in the vicinity of the mounting pad or the test pad, the insulating layer is not formed on the mounting pad or the test pad.

Further, according to the above-mentioned structure, since the conductive patterns each are formed by laminating the first conductive layer, the insulating layer, and the ITO layer in this order in regions other than the region where the member is mounted to overlap the mounting substrate in plan view, it is possible to form the test pad in the conductive pattern such that a test probe can come into contact with the test pad, even if the member to be mounted has a small size. In addition, the lead portion of the conductive pattern has a two-layered structure of the first conductive layer and the insulating layer. Therefore, when air or water is permeated into portions where the lead portions are closer to each other, corrosion does not occur therein since the lead portions are covered with the insulating layer, which is an outermost layer. Further, the two-layered structure is formed by patterning the second conductive layer and the ITO layer formed on the insulting layer. Therefore, according to this patterning, it is possible to form the two-layered structure in a predetermined region with high precision, unlike the resin coating method. Thus, even if the insulating layer is formed as the outermost layer of the lead portion at a position in the vicinity of the mounting pad or the test pad, the insulating layer is not formed on the mounting pad or the test pad.

Moreover, signal line portions having a three-layered structure formed by laminating the first conductive layer, the insulating layer, and the second conductive layer, which is an outermost layer, in this order extend from the lead portions, respectively. In this case, it is preferable that the signal line portions be coated with a covering member for partially covering the mounting substrate, and that the mounting pads, the test pads, and the lead portions be arranged in a region protruding from the covering member of the mounting substrate. According to this structure, since the signal line portions are not exposed from the covering member at all, corrosion does not occur in the signal line portions.

Further, it is preferable that the insulating layer be selectively formed on only the first conductive layer.

Furthermore, for example, it is preferable that the first conductive layer be made of Ta or Ta alloy, such as TaW (tantalum-tungsten), that the insulating layer be made of $TaO_x$, that the second conductive layer be made of Cr or Cr alloy, and that the third conductive layer be made of indium tin oxide (ITO).

Moreover, it is preferable that the insulating layer be provided with removed portions for electrically connecting the third conductive layer of the mounting pads and the test pads to the first conductive layer. According to this structure, even if the second conductive layer or the third conductive layer is cut in the lengthwise direction of the conductive patterns at any positions, it is possible to easily and reliably secure electrical connection therebetween via the first conductive layer.

Further, it is preferable that the insulating layer be provided with removed portions for electrically connecting the first conductive layer to the ITO layer of the mounting pads and the test pads. According to this structure, even if the second conductive layer or the ITO layer is cut in the lengthwise direction of the conductive patterns at any positions, it is possible to easily and reliably secure electrical connection therebetween via the first conductive layer.

Furthermore, it is preferable that, in the mounting pad, the second conductive layer be formed between the insulating layer and the third conductive layer.

In addition, it is preferable that, in the mounting pad, the second conductive layer be formed between the insulating layer and the ITO layer.

Moreover, it is preferable that, in the test pad, the second conductive layer be formed between the insulating layer and the third conductive layer.

Also, it is preferable that, in the test pad, the second conductive layer be formed between the insulating layer and the ITO layer.

Further, in the above-mentioned structure, the mounted member is an IC. In this case, it is preferable that the mounting pads are output pads for outputting signals from the IC. In an IC used for a driving IC for the electro-optical device, the number of mounting pads for outputting signals from the IC is larger than that of mounting pads for inputting signals to the IC, and a plurality of conductive patterns extends from the mounting pads for output. Therefore, the conductive patterns positioned at the output side are arranged closer to each other. In this case, corrosion easily occurs at the output side, and thus it is more effective to apply the invention to the output side.

The mounting structure according to the above-mentioned aspects of the invention can be applied to an electro-optical device. In this case, the mounting substrate is an electro-optical device substrate having an electro-optical material in a region in which a plurality of pixels are arranged in a matrix, and the plurality of conductive patterns are pixel driving signal lines extending from a mounting region of the member to the region in which the electro-optical material is held.

Further, in the electro-optical device substrate, each of the plurality of pixels is provided with a pixel switching thin film diode having a three-layered structure of the first conductive layer, the insulating layer, and the second conductive layer and a pixel electrode composed of the third conductive layer that is electrically connected to the signal line portion through the thin film diode. In this case, since the signal line originally has a three-layered structure of the first conductive layer, the insulating layer, and the second conductive layer, it is not necessary to provide an additional layer. In addition, an oxidation film formed by anodizing or thermally oxidizing the first conductive layer is used as the insulating layer. For example, the first conductive layer is made of Ta or Ta alloy, such as Taw (tantalum-tungsten), and the insulating layer is made of $TaO_x$ (tantalum oxide). Therefore, since the insulating layer is formed on only the first conductive layer, it is possible to selectively form the insulating film in a predetermined region with high precision.

Furthermore, in the electro-optical device substrate, the insulating layer may be formed at least along an outer periphery of the region where the electro-optical material is held. In this case, a sealing member for bonding a pair of substrates opposite to each other is used as the insulating layer in a liquid crystal device. In addition, in an electroluminescent display device, the resin layer is a sealing resin for preventing water or air from being permeating into electroluminescent elements. In this case, it is preferable that the signal lines be formed at the inside of the region where the resin layer is formed, and that the lead portions, the test pads, and the mounting pads be formed at the outside of the region where the resin layer is formed. Therefore, even if the lead portions are exposed to the outside of the region where the resin layer is formed, corrosion does not occur therein since the insulating layer is the outermost layer thereof. In addition, since the mounting pads are covered with an anisotropic conductive material used for mounting a member, such as an IC, corrosion does not occur in the mounting pads. Further, since the first conductive layer is provided at a lower layer of the test pad, a defect, such as the cutting of a wiring line, does not occur even if corrosion occurs in the third conductive layer.

The invention can be applied to an electro-optical device substrate comprising a plurality of mounting pads each constituting a portion of a signal line extending in a Y direction are arranged in an X direction, the X direction and the Y direction being two directions orthogonal to each other, and an electro-optical material held in a region where a plurality of pixels are arranged in a matrix. In this case, a first conductive layer, an insulating layer, a second conductive layer, and a third conductive layer are formed on the electro-optical device substrate in this order from a lower side to an upper side. In addition, each signal line includes the mounting pad that has a three-layered structure formed by laminating the first conductive layer, the insulating layer, and the third conductive layer, which is an outermost layer, in this order; a test pad that is positioned adjacent to a region where the mounting pad is formed, outside a region where an IC or flexible substrate is mounted, and that has the three-layered structure formed by laminating the first conductive layer, the insulating layer, and the third conductive layer, which is the outermost layer, in this order; and a lead portion that extends from the test pad, and that has a two-layered structure of the first conductive layer and the insulating layer, which is an outermost layer.

Furthermore, the invention can be applied to an electro-optical device substrate comprising a plurality of mounting pads each constituting a portion of a signal line extending in a Y direction are arranged in an X direction, the X direction and the Y direction being two directions orthogonal to each other, and an electro-optical material held in a region where a plurality of pixels are arranged in a matrix. In the electro-optical device substrate, each signal line includes the mounting pad that has a three-layered structure formed by laminating a first conductive layer, an insulating layer, and an ITO layer, which is an outermost layer, in this order; a test pad that is positioned adjacent to a region where the mounting pad is formed, outside a region where an IC or flexible substrate is mounted, and that has the three-layered structure formed by laminating the first conductive layer, the insulating layer, and the ITO layer, which is the outermost layer, in this order; and a lead portion that extends from the test pad, and that has a two-layered structure of the first conductive layer and the insulating layer, which is an outermost layer.

Moreover, an electro-optical device according to an aspect of the invention is a liquid crystal device or an electroluminescent display device, and the electro-optical device can be used for an electronic apparatus, such as a cellular phone or a mobile computer.

BRIEF DESCRIPTION OF THE DRAWINGS

The invention will be described with reference to the accompanying drawings, wherein like numbers reference like elements, and wherein:

FIG. 6 is a process diagram illustrating a method of manufacturing the electro-optical device shown in FIG. 2;

FIG. 9 is a block diagram schematically illustrating the structure of an electro-optical device composed of an active matrix liquid crystal device in which thin film transistors (TFTs) are used as pixel switching element.

DESCRIPTION OF THE EMBODIMENTS

Hereinafter, preferred embodiments of the invention will be described with reference to the accompanying drawings.

First Embodiment

Overall Structure of Electro-optical Device

Figure 1:
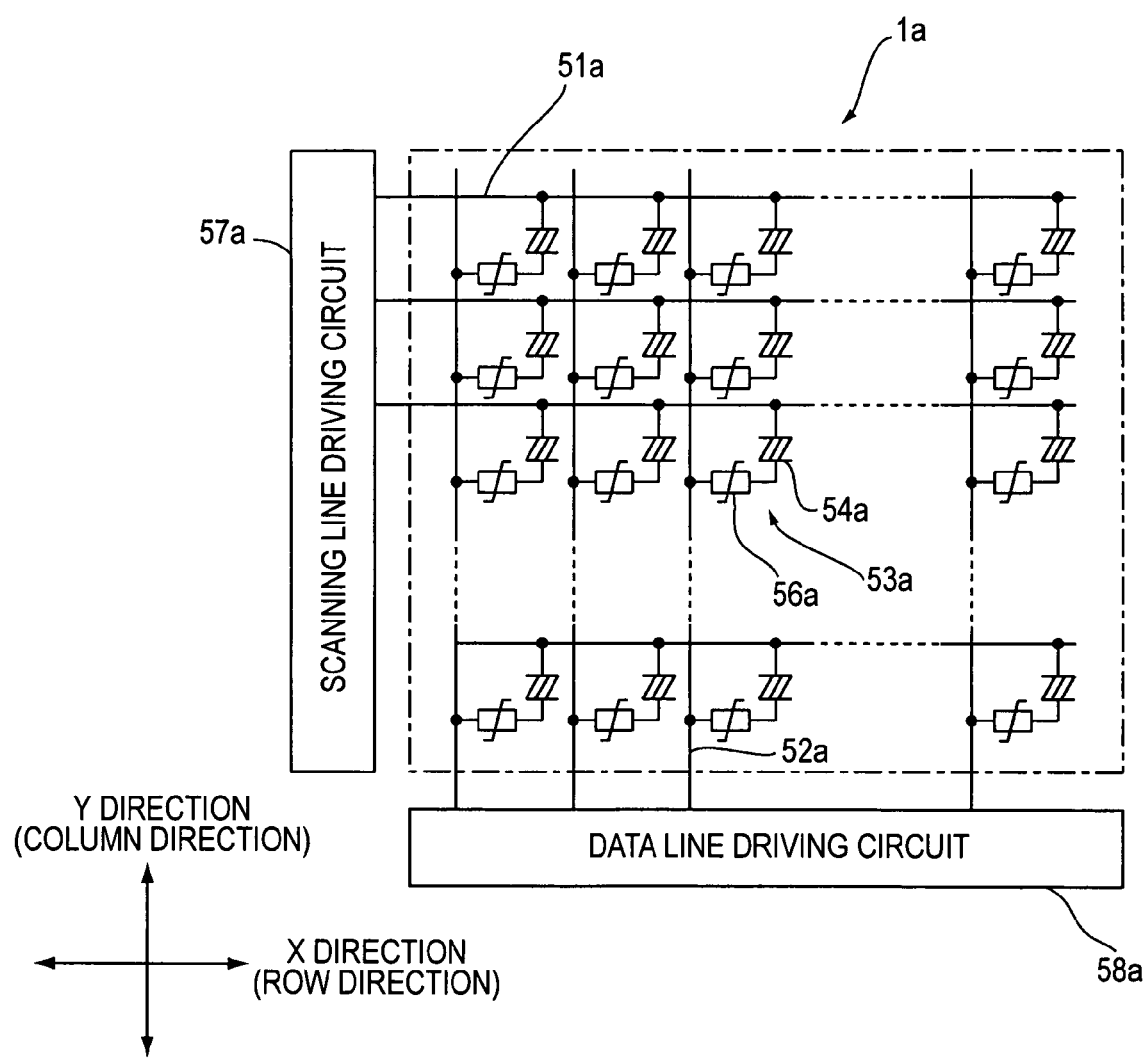
FIG. 1 is a block diagram schematically illustrating the structure of an electro-optical device composed of an active matrix liquid crystal device using TFDs as pixel switching elements.
Figure 2A:
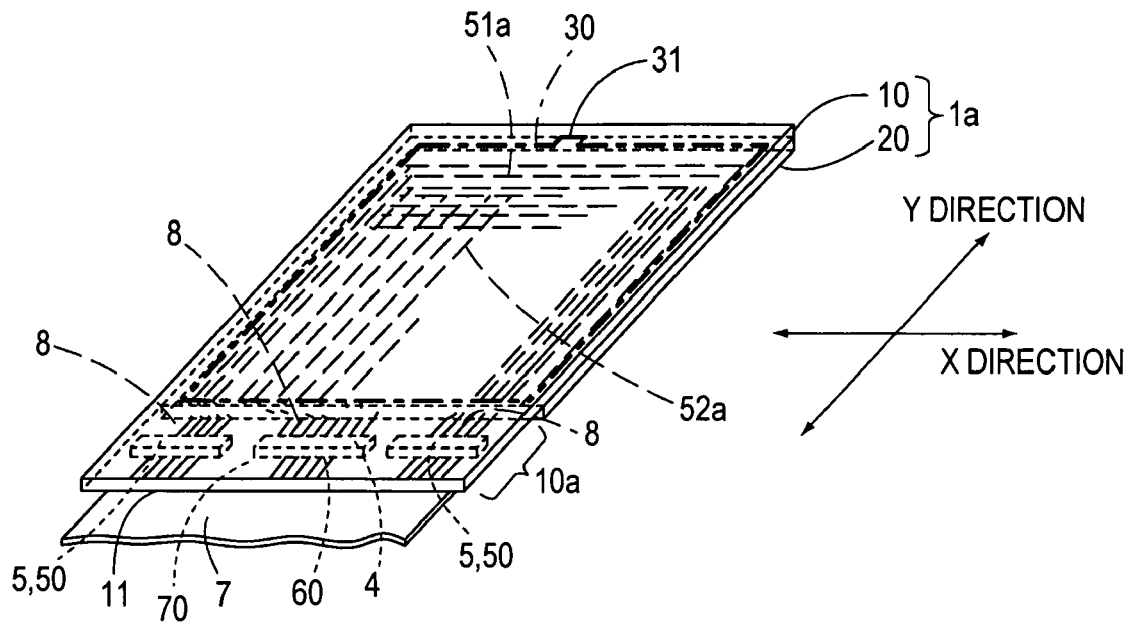
FIG. 2A is a schematic perspective view of an electro-optical device according to a first embodiment of the invention, as viewed from an element substrate.
Figure 2B:
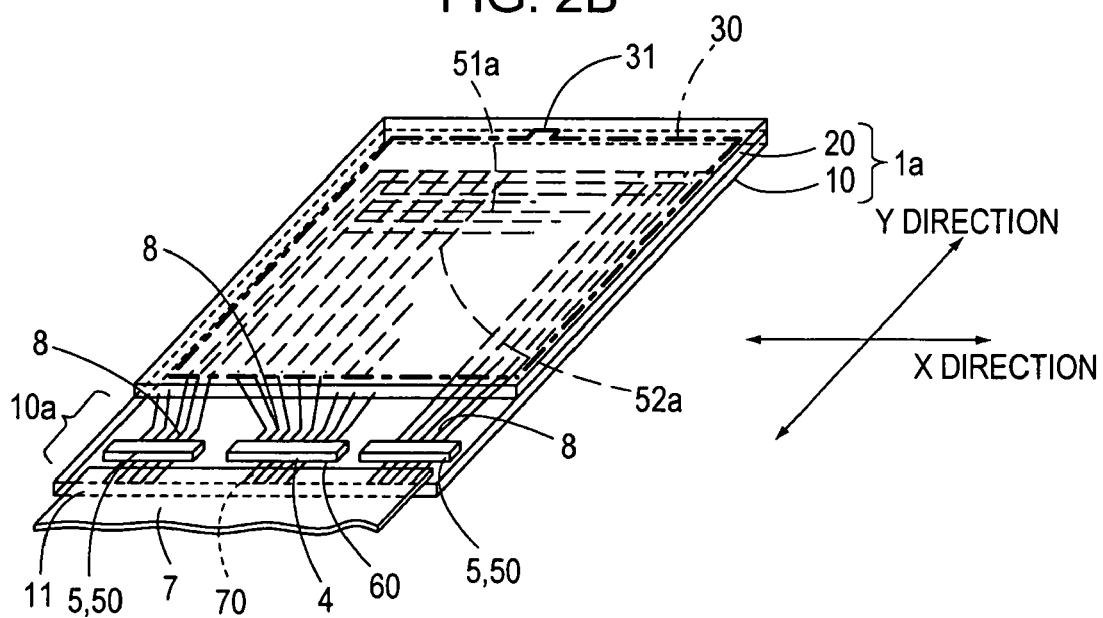
FIG. 2B is a schematic perspective view of the electro-optical device according to the first embodiment of the invention, as viewed from a counter substrate.
Figure 3A:
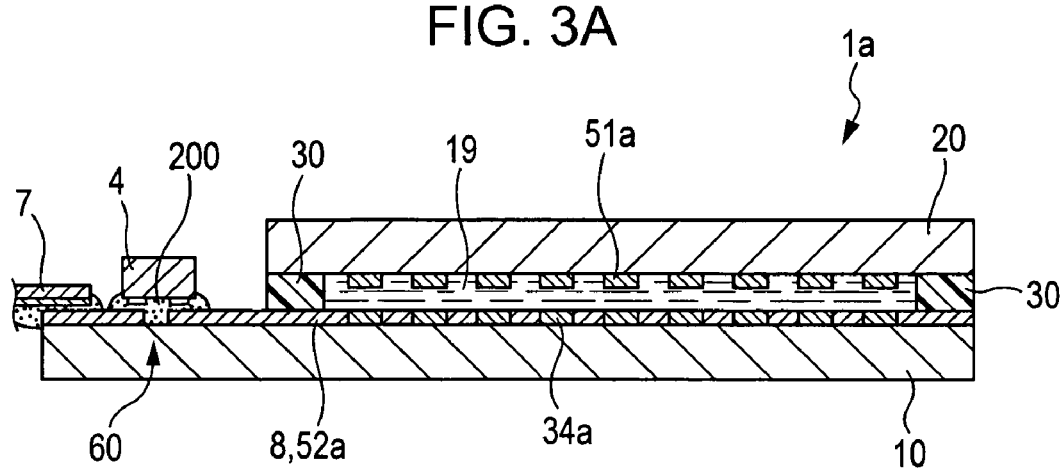
FIG. 3A is a cross-sectional view of the electro-optical device shown in FIG. 2 when pixel electrodes are cut along the Y direction.
Figure 3B:
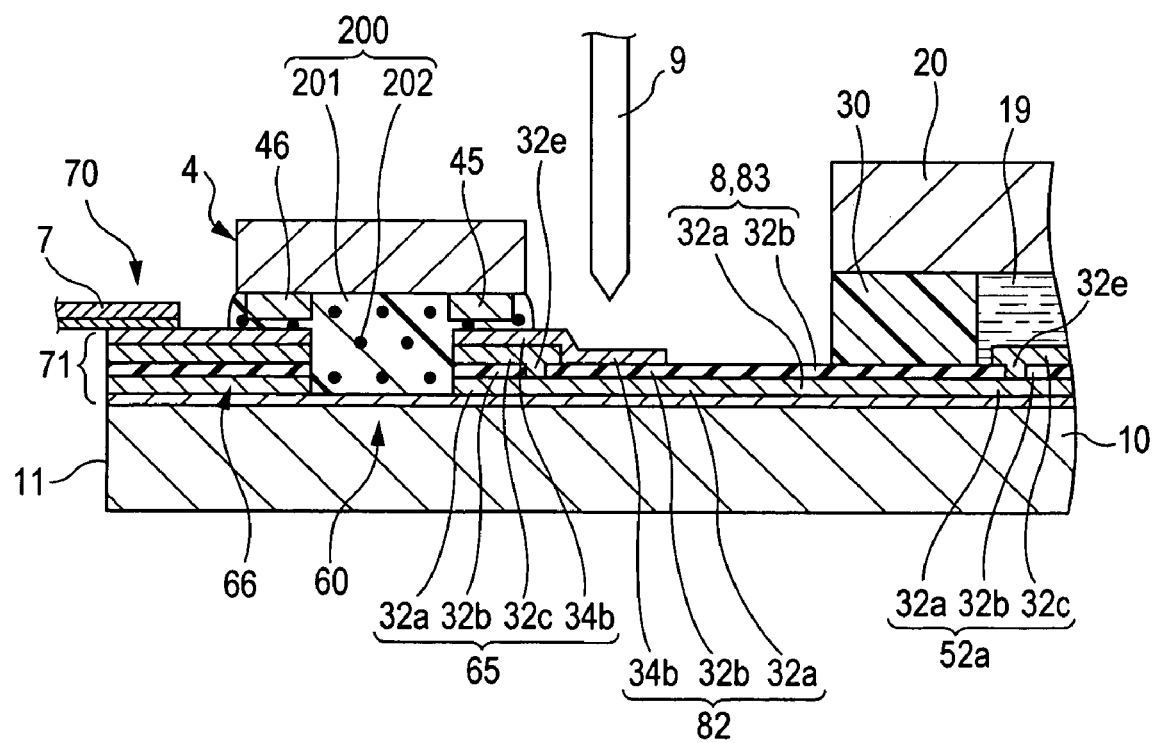
FIG. 3B is an explanatory diagram illustrating conductive patterns formed on the element substrate of the electro-optical device.

FIG. 1 is a block diagram illustrating the electrical structure of an electro-optical device. FIGS. 2A and 2B are perspective views schematically illustrating an electro-optical device according to a first embodiment, as viewed from an element substrate and a counter substrate, respectively. FIG. 3A is a cross-sectional view taken along the Y direction of the electro-optical device shown in FIG. 2 to pass through pixel electrodes, and FIG. 3B is a view illustrating conductive patterns formed on the element substrate of the electro-optical device. In addition, in the drawings of the invention, each layer and each member are shown on different scales in order to make the layer and member more recognizable. Further, the number of the conductive patterns or pads shown in the drawings is smaller than the actual number thereof.

An electro-optical device 1a shown in FIG. 1 is an active matrix liquid crystal device using thin film diodes (TFDs) as pixel switching elements. In the electro-optical device 1a, when two directions orthogonal to each other are the X direction and the Y direction, a plurality of scanning lines 51a extends in the X direction (row direction), and a plurality of data lines 52a extends in the Y direction (column direction). A plurality of pixels 53a are formed corresponding to intersections of the scanning lines 51a and the data lines 52a, and the plurality of pixels 53a are arranged in a matrix. In these pixels 53a, a liquid crystal layer 54a and pixel switching TFDs 56a are connected to each other in series. The respective scanning lines 51a are driven by a scanning line driving circuit 57a, and the respective data lines 52a are driven by a data line driving circuit 58a.

In the structure of the electro-optical device 1a, as shown in FIGS. 2A, 2B, 3A, and 3B, an element substrate 10 (an electro-optical device substrate/a member to be mounted) and a counter substrate 20 (a covering member) are bonded to each other by a sealing member 30 (a resin layer/a covering member), and liquid crystal 19, serving as an electro-optical material, is sealed in a region surrounded by the two substrates and the sealing member 30. The sealing member 30 is formed substantially in a rectangular frame shape along the circumference of the counter substrate 20, and a portion of the sealing member 30 is opened so that the liquid crystal 19 is injected thereinto. Therefore, after the liquid crystal 19 is injected, the opening portion is sealed by a sealant 31.

The element substrate 10 and the counter substrate 20 are plate-shaped members made of a transmissive material, such as glass, quartz, or plastic. The plurality of data lines 52a, the pixel switching TFDs (not shown), pixel electrodes 34a, an alignment film (not shown), etc., are formed on an inner surface (a surface facing the liquid crystal 19) of the element substrate 10. Meanwhile, the plurality of scanning lines 51a is formed on an inner surface of the counter substrate 20, and an alignment film (not shown) is formed on the scanning lines 51a.

Further, polarizing plates for polarizing incident light, retardation plates for compensating for interference colors, etc., are properly bonded to the outer surfaces of the element substrate 10 and the counter substrate 20, respectively. In addition, when color display is performed, R (red), G (green), and B (blue) filters (not shown) are formed in a predetermined arrangement in regions on the counter substrate 20 opposite to the pixel electrodes 34a, and a black matrix (not shown) is formed in regions not opposite to the pixel electrodes 34a. Further, on the surface having the color filters and the black matrix thereon, a planarizing layer for planarizing and protecting the surface is coated, and the scanning lines 51a are formed on the planarizing layer. However, since the polarizing plates, the retardation plates, the color filters, the black matrix, and the planarizing layer are not directly related to the invention, the description and illustration thereof will be omitted.

Structure of TFD

Figure 4:
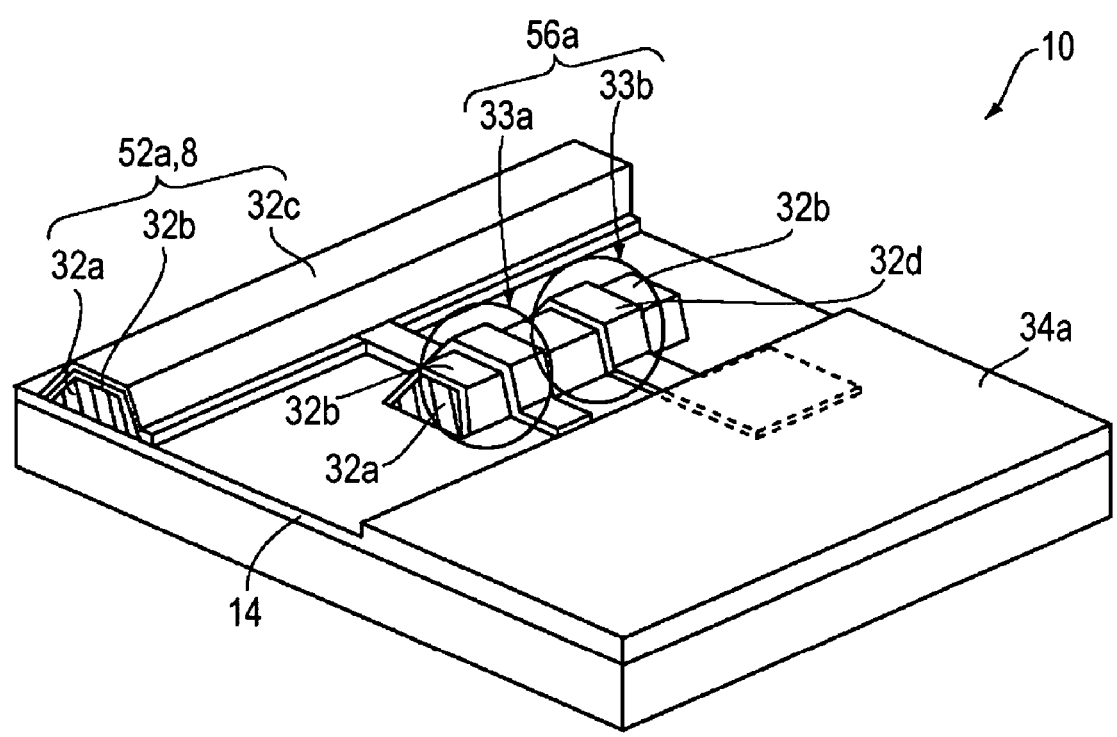
FIG. 4 is an explanatory diagram illustrating a TFD that is used as a pixel switching element in the electro-optical device shown in FIG. 2.

FIG. 4 is a view illustrating the TFD serving as a pixel switching element in the electro-optical device shown in FIG. 2.

In FIG. 4, a base layer 14 is formed on the surface of the element substrate 10, and the TFD 56a has two TFD elements, that is, a first TFD element 33a and a second TFD element 33b formed on the base layer 14 in a so-called back-to-back structure. Therefore, in the TFD 56a, the non-linear characteristic between a voltage and a current is symmetric in the positive and negative directions. The base layer 14 is made of, for example, tantalum oxide ($Ta_2O_5$) with a thickness of about 50 to 200 nm in order to improve the adhesion of the TFD 56a and to prevent the diffusion of impurities in the element substrate 10. The first and second TFD elements 33a and 33b each include a first metal layer 32a (a first conductive layer), an insulating layer 32b formed on the first metal layer 32a, and second metal layers 32c and 32d (second conductive layers) formed on the insulating layer 32b so as to be separated from each other.

In the present embodiment, the first metal layer 32a is composed of, for example, a tantalum film, or a tantalum alloy film, such as TaW (tantalum-tungsten), with a thickness of about 100 to 500 nm, and the insulating layer 32b is tantalum oxide ($Ta_2O_5/TaO_x$) with a thickness of 10 to 35 nm formed by oxidizing the surface of the first metal layer 32a using an anodizing method or thermal oxidation method. The second metal layers 32c and 32d are respectively made of a metallic material, such as chromium (Cr), to have a thickness of about 50 to 300 nm. The second metal layer 32c serves as a portion of the data line 52a, and the second metal layer 32d is connected to the pixel electrode 34a made of a transparent conductive material, such as ITO (indium tin oxide/a third conductive film). The data line 52a has a three-layered structure formed by laminating the first metal layer 32a, the insulating layer 32b, and the second metal layer 32c in this order, and the second metal layer 32c substantially functions as the data line 52a.

Referring to FIG. 2 again, in the electro-optical device 1a, the element substrate 10 has a projecting region 10a protruding from one side of the outer periphery of the sealing member 30 in a state in which the element substrate 10 and the counter substrate 20 are bonded to each other by the sealing member 30. Conductive patterns 8 integrated with the data lines 52a and other conductive patterns 8 electrically connected to the scanning lines 51a by electrical connection between the substrates extend toward the projection region 10a. In order to perform electrical connection between the substrates, resin containing a plurality of conductive particles therein is used as the sealing member 30. For example, plastic particles coated with a metallic material, or resin particles having conductivity are used as the conductive particles functioning to electrically connect the conductive patterns respectively formed on the element substrate 10 and the counter substrate 20. Therefore, in the present embodiment, a first IC 4 (a flip-chip bonded IC chip/a mounting member) for outputting image signals to the data lines 52a and two second ICs 5 (flip-chip bonded IC chips/mounting members) for outputting scanning signals to the scanning lines 51a are mounted on the projecting region 10a of the element substrate 10 in a COG manner, and a flexible substrate 7 is connected to mounting pads 71 formed at one edge (a substrate connecting region 70) of the projecting region 10a.

Structure of IC Mounting Region

Figure 5A:
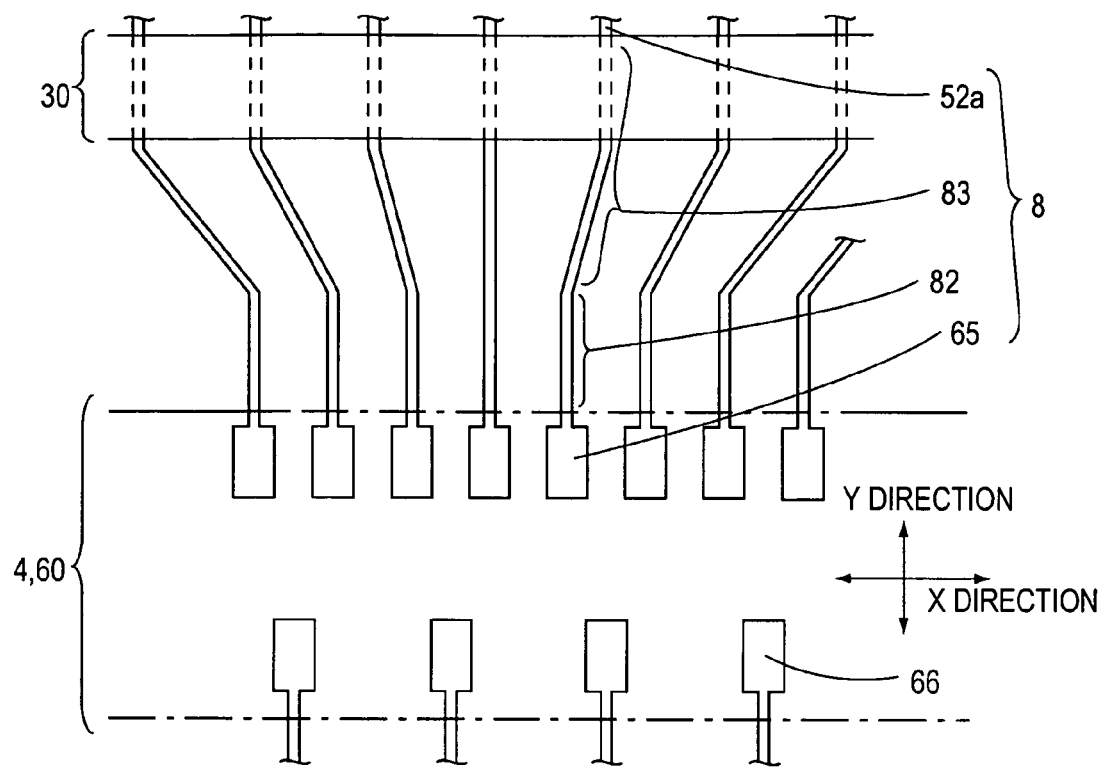
FIG. 5A is an enlarged plan view illustrating some mounting pads positioned at the output side of a first IC mounting region of the element substrate used for the electro-optical device according to the first embodiment of the invention.
Figure 5B:
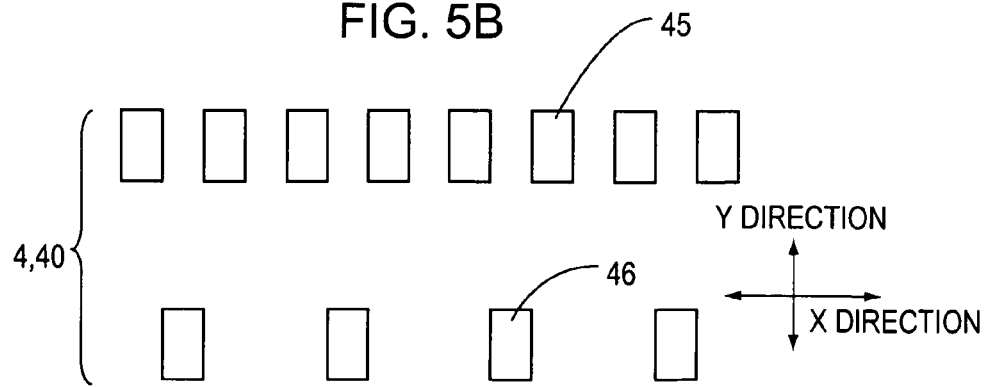
FIG. 5B is an enlarged plan view illustrating some pads positioned at the output side of an IC connected to the mounting pads.

FIG. 5A is an enlarged plan view illustrating a portion of a first IC mounting region of the element substrate used for the electro-optical device according to the first embodiment of the invention, and FIG. 5B is an enlarged plan view illustrating some bumps constituting the IC connected to the mounting pads.

As shown in FIG. 2, a first IC mounting region 60 in which the first IC 4 having a data line driving circuit therein is mounted in a COG manner is formed at the center of the projecting region 10a of the element substrate 10 in the direction of a substrate edge 11, and a plurality of conductive patterns 8 extends from the first IC mounting region 60. In addition, second IC mounting regions 50 in each of which the second IC 5 having a scanning line driving circuit therein is mounted in the COG manner are formed at both sides of the first IC mounting region 60, and a plurality of conductive patterns 8 extend from each of the second IC mounting regions 50. Further, the substrate mounting region 70 to which the flexible substrate 7 is connected is formed closer to the substrate edge 11 than to the IC mounting regions 50 and 60 along the substrate edge 11.

In this case, since the first IC mounting region 60 and the second IC mounting regions 50 can basically have the same structure, the structure of the IC mounting regions will be described centering on the first IC mounting region 60 with reference to FIGS. 5A and 5B. Therefore, the detailed description of the second IC mounting regions 50 will be omitted.

In FIGS. 3A and 5A, in the first IC mounting region 60, a plurality of mounting pads 65 and 66 to which bumps of the first IC 4 are connected through an anisotropic conductive material (a film or paste containing the anisotropic conductive material) are arranged parallel to the substrate edge 11 in the X direction. That is, the mounting pads 65 for output straight extending in the Y direction in the conductive patterns 8 are formed in the first IC mounting region 60 at the position further separated from the substrate edge 11 (at the side where the conductive patterns 8 extend). In addition, the mounting pads 66 for input that are electrically connected to the mounting pads 71 are formed in the first IC mounting region 60 at the position closer to the substrate edge 11 than to the mounting pads 65 for output.

Meanwhile, as shown in FIG. 5B, output bumps 45 are formed on a mounting surface 40 of the first IC 4, corresponding to the structure of the first IC mounting region 60, at the positions overlapping the output mounting pads 65 in plan view, and input pads 46 are formed thereon at the positions overlapping the input mounting pads 66 in plan view.

In the electro-optical device 1a having the above-mentioned structure, in a process of mounting the first IC 4 on the element substrate 10, the anisotropic conductive material, such a film or paste containing anisotropic conductive particles, is arranged on the first IC mounting region 60 described with reference to FIG. 5A, and then the first IC 4 described with reference to FIG. 5B is arranged on the anisotropic conductive material. When pressure is applied to the first IC 4 while heating it using a head (not shown) of a pressing device, as shown in FIG. 3B, the first IC 4 is fixed to a resin 201 containing an anisotropic conductive material 200. Then, the output bumps 45 are electrically connected to the mounting pads 65 for output by conductive particles 202, and the input bumps 46 are electrically connected to the mounting pads 66 for input. Therefore, as shown in FIGS. 2A and 2B, when a signal or power supply voltage is supplied through the flexible substrate 7 to the electro-optical device 1a that has been manufactured, image signals are output from the output bumps 45 of the first IC 4 and are then output through the mounting pads 65 to the data lines 52a each serving as a portion of the conductive pattern 8. In addition, although the mounting structure is not described, the scanning signals are output from the output bumps of the second ICs 5, and the scanning signals are output to the scanning lines 51a through the conductive patterns 8 and electrical connection members between substrates.

Detailed Structure of Conductive Pattern 8

As shown in FIGS. 3 and 5A, in the electro-optical device 1a of the present embodiment, each conductive pattern 8 includes the mounting pad 65 composed of a portion straight extending in the Y direction, a test pad 82 straight extending in the Y direction from the mounting pad 65 to the region defined by the sealing member 30, a lead portion 83 extending in an oblique direction, and the data line 52a (a signal line portion) straight extending therefrom in the Y direction. In addition, in the electro-optical device 1a of the present embodiment, as described with reference to FIG. 4, the first metal layer 32a (the first conductive layer) composed of, for example, a tantalum film or TaW film with a thickness of about 100 to 500 nm, the insulating film 32b composed of tantalum oxide with a thickness of 10 to 35 nm that is formed by oxidizing the surface of the first metal layer 32a, the second metal layer 32c (the second conductive layer) having a thickness of 50 to 300 nm that is made of, for example, chromium, and an ITO film (the third conductive layer) for forming the pixel electrodes 34a are formed on the element substrate 10 in this order from the lower side to the upper side. Further, in the present embodiment, as will be described below, the laminated structure of the conductive pattern 8 can be optimized for every functional portion.

First, as described above, the data line 52a is a three-layered signal line formed by laminating the first metal layer 32a composed of, for example, a tantalum film or TaW film, the insulating layer 32b made of tantalum oxide, and the second metal layer 32c made of, for example, chromium in this order, and the outermost layer thereof is the second metal layer 32c.

The mounting pad 65 has a four-layered structure formed by laminating the first metal layer 32a composed of, for example, a tantalum film or TaW film, the insulating layer 32b made of tantalum oxide, the second metal layer 32c made of, for example, chromium, and the ITO film 34b simultaneously formed with the pixel electrodes 34a in this order, and the outermost layer thereof is the ITO film 34b harder than chromium. In addition, the mounting pad 66 for input and the mounting pad 71 for the flexible substrate 7 have the same structure as the mounting pad 65.

Meanwhile, the lead portion 83 has a two-layered structure of the first metal layer 32a composed of, for example, a tantalum film or Taw film and the insulating layer 32b made of tantalum oxide, and the outermost layer thereof is the insulating layer 32b. Herein, the lead portion 83 has the two-layered structure in a region overlapping one side of the sealing member 30 in plan view and is in an exposed state. On the other hand, the data line 52a whose outermost layer is the second metal layer 32c does not protrude at all from the region where the sealing member 30 is formed.

Further, in the present embodiment, a portion of the conductive pattern 8 straight extending in the Y direction at a position adjacent to, in the Y direction, the region where the output mounting pad 65 is formed (the IC mounting region 60) is used as the test pad 82 with which a test probe 9 comes into contact at the time of the test, which will be described later, and the test pad 82 is formed at the outside of the IC mounting region 60. Here, the test pad 82 has a three-layered structure formed by laminating the first metal layer 32a composed of, for example, a tantalum film or TaW film, the insulating layer 32b made of tantalum oxide, and the ITO film 34b simultaneously formed with the pixel electrodes 34a, which is an outermost layer, in this order.

The ITO film 34b, which is the outermost layer, is formed on only the mounting pad 65 and the test pad 82 of the conductive pattern 8, and the second metal layer 32c is not formed at the lead portion 83 in the lengthwise direction of the conductive pattern 8. Further, removed portions 32e are provided in the insulating layer 32b for directly bringing the first metal layer 32a into contact with the second metal layer 32c, and the ITO film 34b constituting the outermost layer of the mounting pad 65 and the test pad 82 is electrically connected to the first metal layer 32*a* through the second metal layer 32*c*. Therefore, since the ITO film 34*b* constituting the outermost layer of the mounting pad 65 and the test pad 82 is electrically connected to the first metal layer 32*a* through the second metal layer 32*c*, it is possible to easily and reliably secure the electrical connection of the entire conductive patterns 8.

Further, in the projecting region 10*a* of the element substrate 10, the conductive patterns 8 extend from the second IC mounting regions 50 to be electrically connected to the scanning lines 51*a*, and the conductive patterns 8 are electrically connected to the scanning lines 51*a* by electrical connection between substrates. Therefore, the scanning lines 51*a* are not formed on the conductive patterns 8 extending from the second IC mounting regions 50, but a four-layered mounting pad, a three-layered test pad, and a two-layered lead portion are formed thereon, similar to the conductive pattern 8 extending from the first IC mounting region 60.

Main Effects of the Present Embodiment

As such, in the electro-optical device 1*a* of the present embodiment, in the conductive pattern 8, the data line 52*a* having the second metal layer 32*c* as the outermost layer does not protrude toward the outside of the region where the sealing member 30 is formed and is also covered with the sealing member 30 or the counter substrate 20 so as not to be exposed. Therefore, only the lead portion 83, the test pad 82, and the mounting pad 65 of the conductive pattern 8 are exposed at the outside of the region where the sealing member 30 is formed. Thus, since air or water is not permeated into the data line 52*a* of the conductive pattern 8 having the second metal layer 32*c* as its outermost layer, corrosion does not occur therein. In addition, since the lead portion 83 has the insulating layer 32*b* as its outermost layer, corrosion does not occur therein. Further, since the mounting pad 65 is sealed with an anisotropic conductive member 200 with the IC 4 mounted thereon, corrosion does not occur therein. Since the test pad 82 has the ITO film 34*b* as its outermost layer, there is a possibility that corrosion will occur. However, if the test pad 82 is completely covered with the anisotropic conductive member 200 used for mounting the IC 4, corrosion does not occur. In addition, although the test pad 82 is exposed from the anisotropic conductive member 200 to be electrically corroded, there is no trouble in using the test pad 82 since the test has already been performed. Further, since the mounting pad 65 is electrically connected to the data line 52*a* through the first metal layer 32*a*, the conductive pattern 8 is not cut even though corrosion occurs in the test pad 82.

As described later, since the insulating film 32*b* is formed by anodizing or thermally oxidizing the first metal layer 32*a* composed of, for example, a single tantalum film or tantalum alloy film, the insulating film 32*b* is selectively formed on the first metal layer 32*a*. In addition, each component of the conductive pattern 8 can have any one of a two-layered structure, a three-layered structure, and a four-layered structure according to how to pattern a chromium film or an ITO film. This structure enables the respective components to be formed with higher precision, compared to a resin coating method. Thus, even when the outermost layer of the conductive pattern 8 adjacent to the mounting pad 65 or the test pattern 82 is used as the insulating layer, the insulating layer is not formed on the mounting pad 65 or the test pad 82; unlike the resin coating method.

Further, in the present embodiment, since a portion of the conductive pattern 8 straight extending in the Y direction at a position adjacent to the mounting pad 65 for output in the Y direction is used as the test pad 82, it is not necessary to arrange the test pad 82 in the region (the IC mounting region 60) overlapping the IC 4 in plan view. Thus, it is possible to accurately arrange the test pad 82 although the IC 4 has a small size.

Method of Manufacturing Electro-Optical Device 1*a*

FIGS. 6A to 6F are process diagrams illustrating a process of manufacturing the element substrate of a method of manufacturing the electro-optical device 1*a*.

In the method of manufacturing the element substrate 10 used for the electro-optical device 1*a* of the present embodiment, first, as shown in FIGS. 3B, 4, and 6A, tantalum oxide, for example, $Ta_2O_5$, is deposited with a uniform thickness on the element substrate 10 to form the base layer 14. Subsequently, a Ta film or TaW film is deposited thereon with a uniform thickness by a sputtering method, and then the first metal layer 32*a* of the conductive pattern 8 (the data line 52*a*) and the first metal layer 32*a* of the TFD 56*a* are simultaneously patterned by a photolithography technique. At that time, the first metal layer 32*a* of the conductive pattern 8 is connected to the first metal layer 32*a* of the TFD 56*a* by a bridge portion (not shown). In addition, a feeding pattern (not shown) is connected to the first metal layer 32*a*.

Next, an anodizing process is performed in a state in which a plurality of element substrates 10 is immersed in an electrolytic solution. At that time, a current is applied to the first metal layer 32*a* of the conductive pattern 8, so that, as shown in FIGS. 3B, 4, and 6A, an anodic oxide film, serving as the insulating layer 32*b*, is formed thereon. Then, the element substrate 10 is heated to reduce the density of defects, such as the generation of holes and the dislocation of the insulating layer 32*b*, and to raise an I/V value of the TFD 56*a*. In addition, the first metal layer 32 may be thermally oxidized when the insulating layer 32*b* is formed.

Successively, as shown in FIGS. 3B and 6C, the removed portions 32*e* are formed in the insulating layer 32*b* by a photolithography technique.

Then, after chromium is formed thereon with a uniform thickness by a sputtering method, the second metal layer 32*c* common to the mounting pad 65, the data line 52*a*, and the first TFD 33*a* is formed, and the second metal layer 32*d* of the second TFD 33*b* is formed using a photolithography technique, as shown in FIGS. 3B, 4, and 6D.

Subsequently, the first metal layer 32*a* and the insulating layer 32*b* are patterned by dry etching, so that the mounting pad 71 to which the bumps of the IC 4 and the flexible substrate 7 are connected is separated from the conductive pattern 8, as shown in FIGS. 3B, 4, and 6E. At that time, the bridge portion or the feeding pattern is removed from the element substrate 10. In addition, the base layer 14 of corresponding to the pixel electrodes 34*a* is removed, so that the element substrate 10 is exposed.

Next, the ITO film is formed thereon with a uniform thickness by a sputtering method and is then patterned by a photolithography technique. Then, as shown in FIGS. 3B, 4, and 6F, the pixel electrode 34*a* having a predetermined shape corresponding to the side of one pixel is formed such that a portion thereof overlaps the second metal layer 32*d* in plan view. In addition, the ITO layer 34*b* corresponding to the mounting pads 65, 66, and 71 and the test pad 82 remains.

Thereafter, although not shown, polyimide, polyvinyl alcohol, or the like is deposited with a uniform thickness on the element substrate 10 to form an alignment film, and then an alignment process, such as a rubbing process, is performed on the alignment film.

Then, as shown in FIGS. 2 and 3B, the sealing member 30 is coated in a ring shape by a dispenser or silk-screen process, and the counter substrate 20 that is separately manufactured is bonded to the element substrate 10 with the sealing member 30 interposed therebetween. Subsequently, liquid crystal 19 is injected into a region defined by the sealing member 30, and then a liquid crystal injecting hole is sealed.

Successively, a test probe 9 comes into contact with the test pad 82 of the element substrate 10, and then signals are output to the data line 52a and the scanning line 52b through the conductive pattern 8 to drive pixels, thereby testing the operation of the pixels.

Thereafter, the ICs 4 and 5 and the flexible substrate 7 are mounted on the element substrate 10 using the anisotropic conductive member 200, thereby completing the electro-optical device 1a.

Second Embodiment

Figure 7:
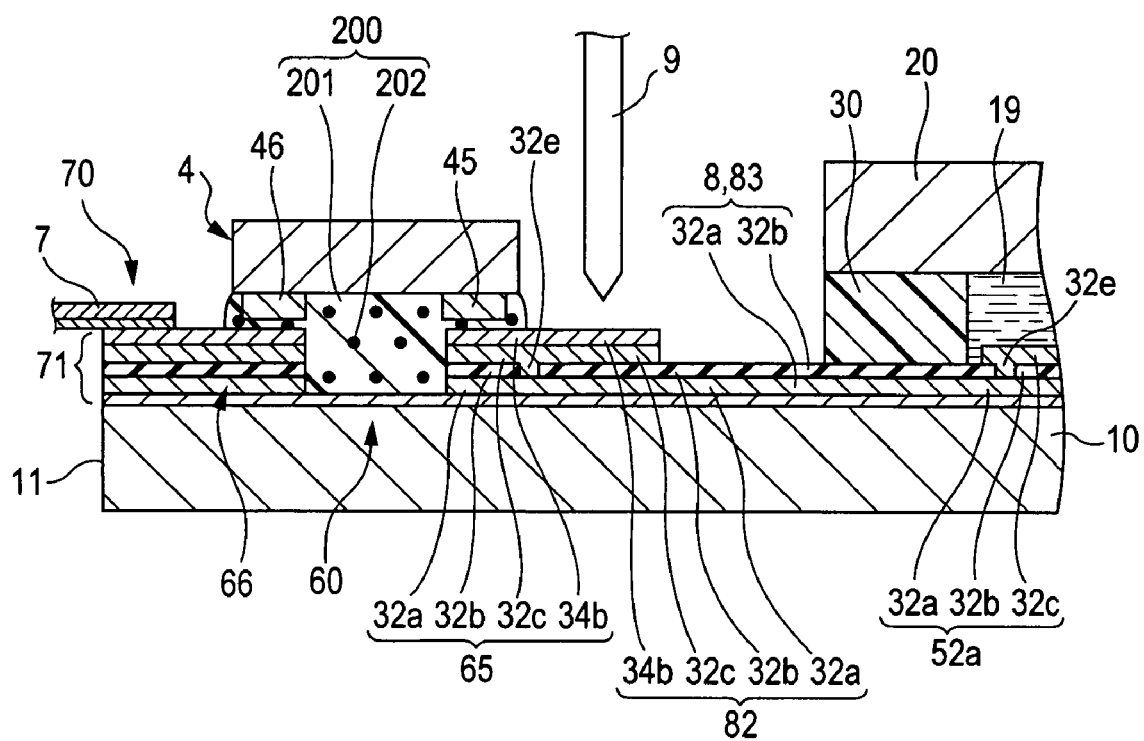
FIG. 7 is an explanatory diagram illustrating the structure of conductive patterns of an electro-optical device according to a second embodiment of the invention.

FIG. 7 is an explanatory diagram illustrating the structure of a conductive pattern of an electro-optical device according to a second embodiment of the invention. The electro-optical device of the present embodiment has the same basic structure as that in the first embodiment. Therefore, in the electro-optical device of the second embodiment, the same components as those in the first embodiment have the same reference numerals, and thus the description thereof will be omitted.

The test pad 82 of the electro-optical device according to the first embodiment has a three-layered structure in which the first metal layer 32a composed of, for example, a single tantalum film or TaW film, the insulating layer 32b made of tantalum oxide, and the ITO film 34b simultaneously formed with the pixel electrode 34a are laminated in this order. However, as shown in FIG. 7, a test pad 82 of the electro-optical device according to the second embodiment has a four-layered structure in which the first metal layer 32a composed of, for example, the single tantalum film or TaW film, the insulating layer 32b made of tantalum oxide, the second metal layer 32c made of, for example, chromium, and the ITO film 34b simultaneously formed with the pixel electrode 34a are laminated in this order. The other structures of the present embodiment are the same as those in the first embodiment. That is, the conductive pattern 8 includes the mounting pad 65 composed of a portion straight extending in the Y direction, the test pad 82 straight extending from the mounting pad 65 to the region defined by the sealing member 30 in the Y direction, the lead portion 83 extending in an oblique direction, and the data line 52a (the signal line portion) straight extending in the Y direction. The data line 52a is a three-layered signal line formed by laminating the first metal layer 32a composed of, for example, a single tantalum film or TaW film, the insulating layer 32b made of, for example, tantalum oxide, and the second metal layer 32c made of, for example, chromium in this order, and the outermost layer thereof is the second metal layer 32c. The mounting pad 65 has a four-layered structure formed by laminating the first metal layer 32a composed, for example, of a single tantalum film or TaW film, the insulating layer 32b made of tantalum oxide, the second metal layer 32c made of, for example, chromium, and the ITO film 34b simultaneously formed with the pixel electrodes 34a in this order, and the outermost layer thereof is the ITO film 34b harder than chromium. In addition, the lead portion 83 has a two-layered structure of the first metal layer 32a composed of, for example, a single tantalum film or TaW film, and the insulating layer 32b made of tantalum oxide, and the outermost layer thereof is the insulating layer 32b. Herein, the lead portion 83 has the two-layered structure in a region overlapping one side of the sealing member 32 in plan view and is in an exposed state. On the other hand, the data line 52a whose outermost layer is the second metal layer 32c does not protrude at all from the region where the sealing member 30 is formed.

Third Embodiment

Figure 8A:
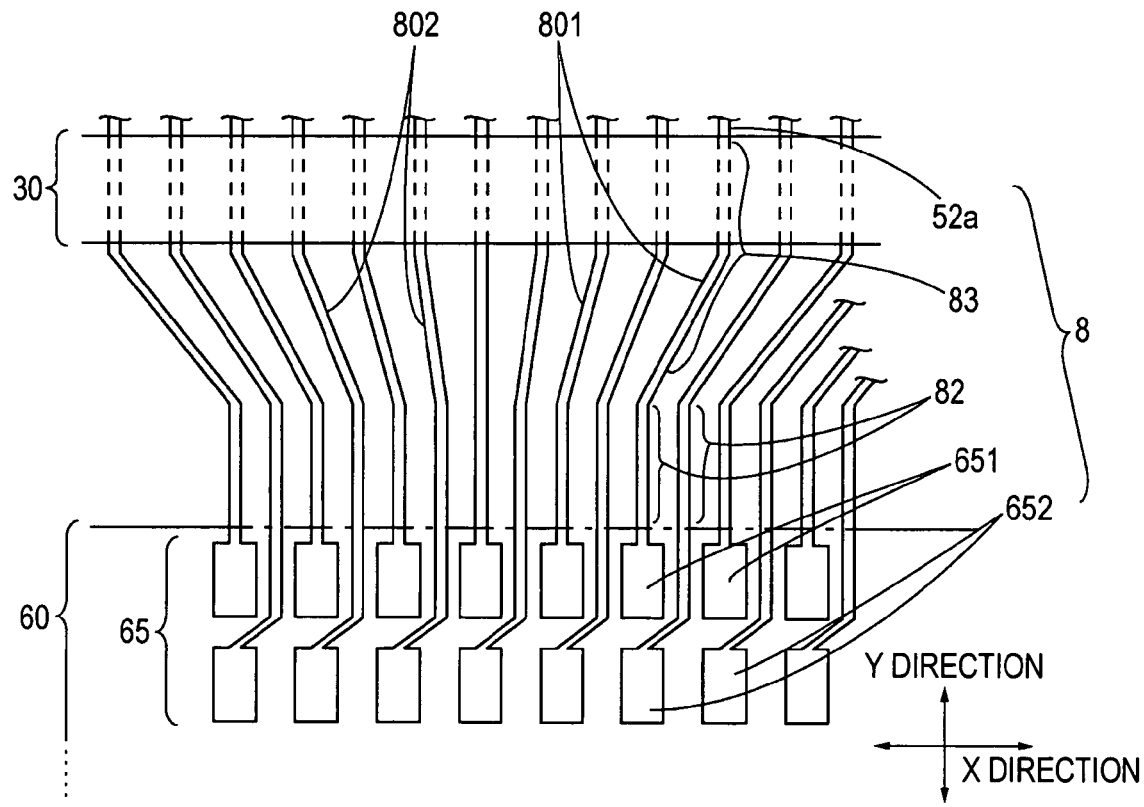
FIG. 8A is an enlarged plan view illustrating some mounting pads positioned at the output side of a first IC mounting region of an element substrate used for an electro-optical device according to a third embodiment of the invention.
Figure 8B:
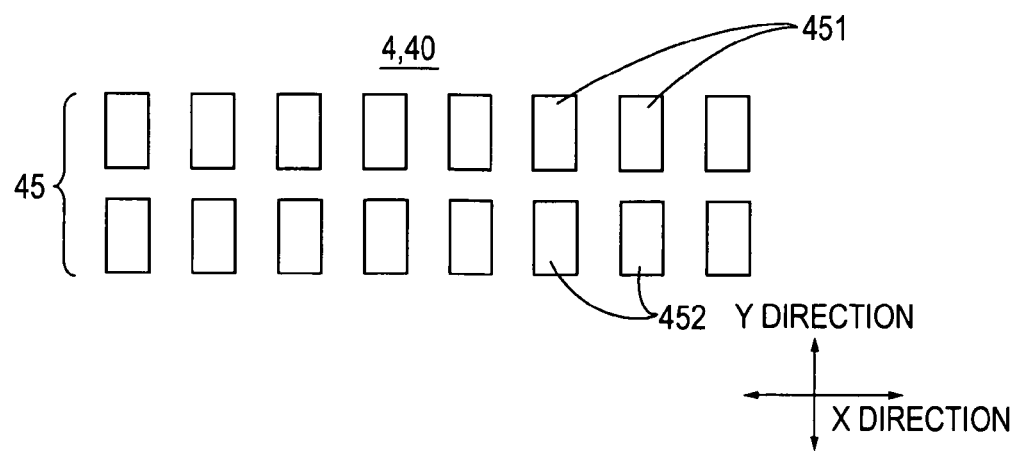
FIG. 8B is an enlarged plan view illustrating some pads positioned at the output side of an IC connected to the mounting pads.

FIG. 8A is an enlarged cross-sectional view illustrating some of mounting pads positioned at the output side of a first IC mounting region on an element substrate that is used for an electro-optical device according to a third embodiment of the invention, and FIG. 8B is an enlarged plan view illustrating some of output pads of an IC connected to this mounting pads.

In the electro-optical device according to the first embodiment, the mounting pads 65 for output and the output bumps 45 of the IC 4 are arranged in a line in the X direction. However, as shown in FIGS. 8A an 8B, the mounting pads 65 for output may be arranged in two rows in the X direction, and the output bumps 45 of the IC 4 may also be arranged in two rows in the X direction. That is, as shown in FIG. 8A, in the first IC mounting region 60 of the element substrate 10, the mounting pads 65 for output include first mounting pads 651 (first mounting pad group) arranged in the X direction at the side where the conductive pattern 8 extends and second mounting pads 652 (second mounting pad group) arranged in the X direction adjacent to the first mounting pads 651 at a position opposite to the side where the conductive pattern 8 extends in the Y direction. In addition, the first mounting pads 651 and the second mounting pads 652 are arranged so as to overlap each other in the Y direction. Therefore, first conductive patterns 801 of a plurality of conductive patterns 8 connected to the first mounting pads 651 extend from the first mounting pads 651 toward the region defined by the sealing member 30, and each first conductive pattern 801 is composed of the test pad 82, the lead portion 83, and the data line 52a. On the other hand, the second conductive patterns 802 connected to the second mounting pads 652 each obliquely extend from the second mounting pad 652 and pass between the first mounting pads 651 to extend toward the region defined by the sealing member 30. Each second mounting pad 652 is composed of the test pad 82, the lead portion 83 and the data line 52a. Here, each conductive pattern 802 passes between the two mounting pads 651, and the respective conductive patterns 802 are inclined in the same direction between the first mounting pads 651 and the second mounting pads 652.

Meanwhile, as shown in FIG. 8B, a mounting surface 40 of the first IC 4 is provided with first bumps 451 (first bump group) arranged in the X direction and second bumps 452 (second bump group) arranged in the X direction at positions adjacent to these first bumps 451 in the Y direction, corresponding to the structure of the first IC mounting region 60. In addition, the first bumps 451 and the second bumps 452 are arranged so as to overlap each other in the Y direction.

In the electro-optical device 1a having the above-mentioned structure, similar to the first embodiment, a portion straight extending in the Y direction at a position adjacent to the region (the first IC mounting region 60) where the mounting pads 651 and 652 for output are formed in the Y direction is used as the test pad 82 with which the test probe 9 comes into contact at the time of the test. This test pad 82 has a three-layered structure formed by laminating the first metal layer 32a composed of, for example, a tantalum film or TaW film, the insulating layer 32b made of tantalum oxide, and the ITO film 34b, which is the outermost layer, simultaneously formed with the pixel electrodes 34a in this order. Also, in the present embodiment, similar to the first embodiment, the data line 52a is a three-layered signal line formed by laminating the first metal layer 32a composed of, for example, a tantalum film or TaW film, the insulating layer 32b made of tantalum oxide, and the second metal layer 32c made of, for example, chromium, in this order, and the outermost layer thereof is the second metal layer 32c. The mounting pad 65 has a four-layered structure formed by laminating the first metal layer 32a composed of, for example, a tantalum film or TaW film, the insulating layer 32b made of tantalum oxide, the second metal layer 32c made of, for example, chromium, and the ITO film 34b simultaneously formed with the pixel electrodes 34a in this order, and the outermost layer thereof is the hard ITO film 34b. In addition, the lead portion 83 has a two-layered structure of the first metal layer 32a composed of, for example, a single tantalum film or TaW film and the insulating layer 32b made of tantalum oxide, and the outermost layer thereof is the insulating layer 32b.

According to this structure, since the lead portion 83 whose outermost layer is the insulating layer 32b has the same structure as that in the first embodiment, the cutting of wiring lines due to corrosion does not occur. In addition, in the present embodiment, since a portion straight extending in the Y direction at a position adjacent to, in the Y direction, the region (the IC mounting region 60) where the mounting pad 65 for output is formed is used as the test pad 82, it is not necessary to arrange the test pattern 82 in the region (the IC mounting region 60) overlapping the IC 4 in plan view. Therefore, even when the size of the IC 4 is reduced, it is possible to accurately arrange the test pattern 82.

Further, in the mounting surface 40 of the first IC 4, two bump groups arranged in the X direction are disposed adjacent to each other in the Y direction, and the mounting bumps 451 belonging to the first bump group and the mounting bumps 452 belonging to the second bump group are arranged so as to overlap each other in the Y direction. In addition, in the IC mounting region 60 of the element substrate 10 corresponding to the first IC 4, two mounting pad groups arranged in the X direction are disposed adjacent to each other in the Y direction, and the first mounting pads 651 belonging to the first mounting group and the second mounting pads 652 belonging to the second group are arranged so as to overlap each other in the Y direction. Therefore, in the present embodiment, it is possible to increase the number of the mounting pads 65 and the bumps 45 arranged in a predetermined region, by the number of pads and bumps corresponding to the second row of the mounting pads 65 (the mounting pads 651 and 652) and the second row of the bumps 45 (the bumps 451 and 452). In addition, the mounting bumps 451 and 452 are arranged so as to overlap each other in the Y direction, and the mounting pads 651 and 652 are also arranged so as to overlap each other in the Y direction. Therefore, when the first IC 4 is mounted using the anisotropic conductive member, for example, an unnecessary resin smoothly flows out in the Y direction. Thus, unnecessary anisotropic conductive particles do not remain partially. As a result, it is possible to prevent a short circuit caused by the partial remaining of the anisotropic conductive particles, and thus to mount the first IC 4 with higher reliability.

Other Embodiments

According to the above-mentioned embodiment, in the conductive pattern 8, each portion extending from the seal member 30 to the mounting pad 65 in an exposed state is used as the lead portion 83 having a two-layered structure in which the insulating layer 32b is the outermost layer. When the intensity of an electric field between adjacent conductive patterns 8 is low, corrosion does not occur. Therefore, in the conductive patterns 8 extending from the sealing member 30 to the mounting pads 65 in an exposed state, a portion thereof where the gap between adjacent conductive patterns 8 is small may be used as the two-layered lead portion 83 having the insulating layer 32b as the outermost layer.

Further, the mounting pad 65 has a four-layered structure formed by laminating the first metal layer 32a composed of, for example, a single tantalum film or TaW film, the insulating layer 32b made of tantalum oxide, the second metal layer 32c made of, for example, chromium, and the ITO film 34b simultaneously formed with the pixel electrodes 34a in this order. However, the mounting pad 65 may have a three-layered structure formed by laminating the first metal layer 32a composed of, for example, a single tantalum film or TaW film, the insulating layer 32b made of tantalum oxide, and the ITO film 34b simultaneously formed with the pixel electrodes 34a in this order. In this case, the ITO film 34b may be directly electrically connected to the first metal layer 32a through the removed portion 32e formed in the insulating layer 32b.

In the third embodiment, the first mounting pads 651 and the second mounting pads 652 are arranged such that they are separated from each other in the X direction by one pitch, and overlap each other in the Y direction. However, one of the first mounting pads 651 and 652 may be separated from the other mounting pad by a half pitch, such that they do not overlap each other in the Y direction.

Furthermore, in the above-mentioned embodiment, since the pitch of the conductive patterns is large at the input sides of the ICs 4 and 5, the invention is applied to only the output sides of the ICs 4 and 5 in order to prevent the generation of corrosion. However, the invention may be applied to the input sides thereof.

Moreover, in the above-mentioned embodiment, the IC 4 is mounted on the element substrate 10, which is a mounting substrate, in a COG manner. However, in the electro-optical device 1a, a flexible substrate on which an IC is mounted in a COF manner may be connected to the element substrate 10. In this case, the mounting pads for mounting the flexible substrate are also formed on the element substrate 10, and the conductive patterns are formed extending from the mounting pads to the region defined by sealing member 30. Therefore, the invention can be applied to such an electro-optical device.

Further, in the above-mentioned embodiment, a transmissive active matrix liquid crystal device in which TFDs are used as non-linear elements has been given as an example. The invention can be applied to a reflective or transflective active matrix liquid crystal device. In addition, the invention can be applied to the following electro-optical devices shown in FIGS. 9 and 10.

Figure 10:
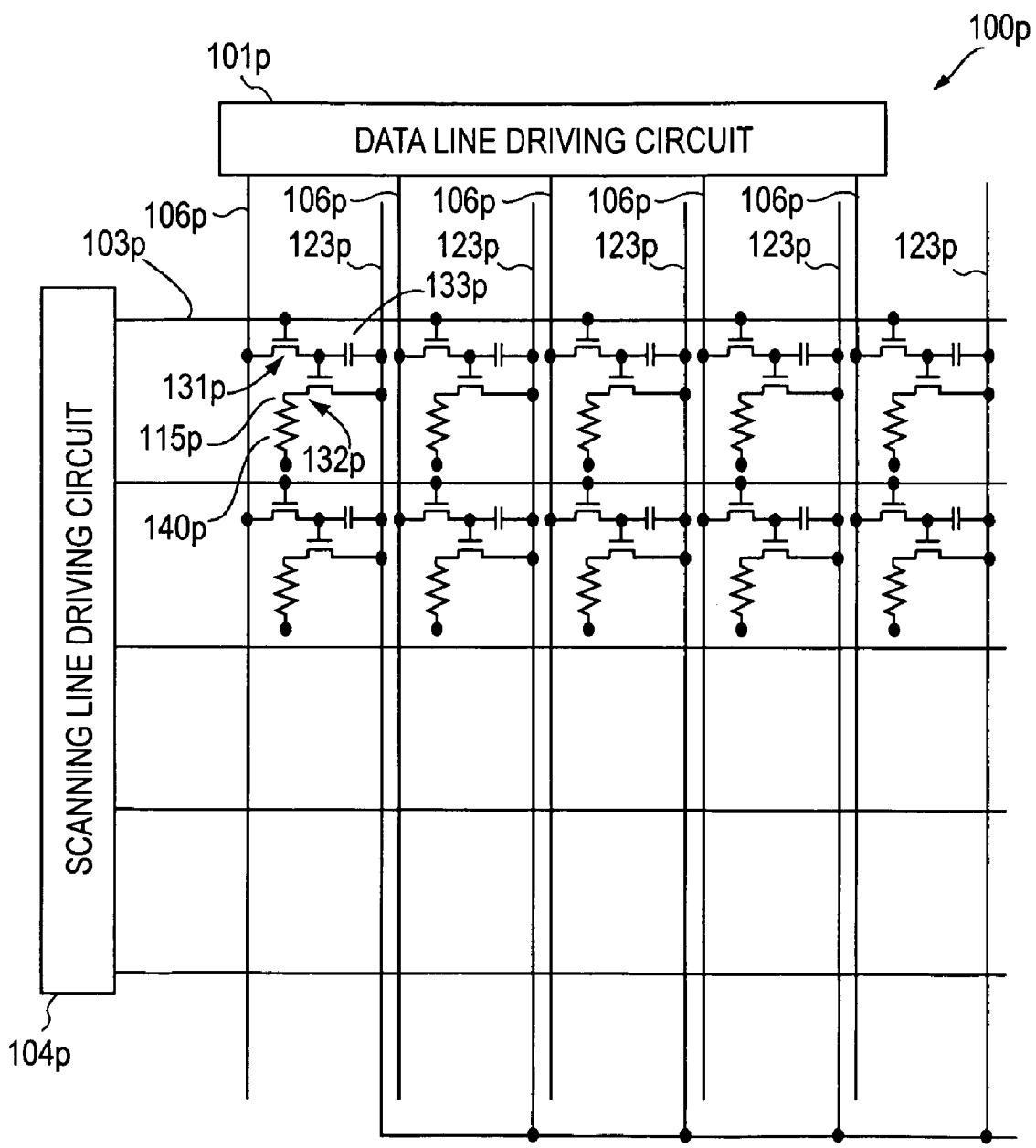
FIG. 10 is a block diagram illustrating an active matrix display device including electroluminescent elements in which a charge-injection-type organic thin film is used as an electro-optical material.

FIG. 9 is a block diagram schematically illustrating the structure of an electro-optical device composed of an active matrix liquid crystal device using thin film transistors (TFTs) as pixel switching elements. FIG. 10 is a block diagram schematically illustrating the structure of an active matrix electro-optical device provided with electroluminescent elements in which a charge-injection-type organic thin film is used as an electro-optical material.

As shown in FIG. 9, in an electro-optical device 100b composed of an active matrix liquid crystal device using the TFTs as the pixel switching elements, each pixel arranged in a matrix is provided with a pixel switching TFT 130b for controlling a pixel electrode 109b, and each data line 106b for supplying image signals is electrically connected to a source of the TFT 130b. The image signals to be written on the data lines 106b is supplied from a data line driving circuit 102b. In addition, each scanning line 131b is electrically connected to a gate of the TFT 130b, and scanning signals are supplied in pulse from a scanning line driving circuit 103b to the scanning lines 131b at a predetermined timing. The pixel electrodes 109b are electrically connected to drains of the TFTs 130, and the image signals supplied from the data lines 106b are written on the respective pixels at a predetermined timing by keeping the TFTs 130b, serving as switching elements, an on state for a predetermined period. Sub-pixel signals having predetermined levels that have been written on liquid crystal through the pixel electrodes 109b are held between the pixel electrodes and a counter electrode formed on the counter substrate (not shown) for a predetermined period. Here, in order to prevent the held pixel signals from leaking, storage capacitors 170b are additionally provided parallel to liquid crystal capacitance formed between the pixel electrodes 109b and the counter electrode. The storage capacitor 170b holds the voltage of the pixel electrode 109b for a longer time than the time when a source voltage is applied by, for example, a three-digit number. In this way, it is possible to improve charge holding characteristics, and thus to realize an electro-optical device capable of displaying an image with a high contrast ratio. In addition, the storage capacitor 170b may be formed between the pixel electrode and a capacitor line 132b, which is a wiring line for forming capacitance, or may be formed between the pixel electrode and the scanning line 131b in the previous stage.

As described above, the liquid crystal is held in the region defined by the sealing member, and the mounting pads and the conductive patterns are formed at the outside of the region defined by the sealing member. Therefore, it is also possible to apply the invention to the liquid crystal device having the above-mentioned structure.

As shown in FIG. 10, an active matrix electro-optical device 100p provided with electroluminescent elements using the charge-injection-type organic thin film is an active matrix display device in which the driving of light-emitting elements, such as light-emitting diodes (LEDs) or electroluminescent (EL) elements that emit light when a driving current flows through an organic semiconductor film, is controlled by TFTs. In addition, since the light-emitting elements used for this type of display device are self-emitting elements, the display device has advantages in that a backlight is not needed and the viewing angel dependence thereof is low.

The electro-optical device 100p shown in FIG. 10 includes a plurality of scanning lines 103p, a plurality of data lines 106p extending in a direction orthogonal to the plurality of scanning lines 103p, a plurality of common feeder lines 123p extending parallel to the data lines 106p, and pixels 115p provided corresponding to intersections of the data lines 106p and the scanning lines 103p. The data lines 106p are connected to a data line driving circuit 101p including a shift register, a level shifter, video lines, and analog switches. The scanning lines 103p are connected to a scanning line driving circuit 104p including a shift register and a level shifter. In addition, each pixel 115p is provided with a first TFT 131p whose gate electrode is supplied with scanning signals through the scanning line 103p, a storage capacitor 133p for holding an image signal supplied from the data line 106p through the first TFT 131p, a second TFT 132p whose gate electrode is supplied with the image signal held in the storage capacitor 133p, and a light emitting element 140p to which a driving current flows from the common feeder line 123p when electrically connected to the common feeder line 123p via the second TFT 132p. The light emitting element 140p is formed by laminating, on the pixel electrode, a hole injecting layer, an organic semiconductor layer, serving as an organic electroluminescent layer, and a counter electrode made of a metallic material, such as calcium or aluminum containing lithium, in this order. The counter electrode is formed on the data lines 106p so as to place across the plurality of pixels 115p.

In the electroluminescent-type electro-optical device having the above-mentioned structure, the element substrate is covered with a sealing resin for protecting the light emitting elements 140p from water or oxygen, and mounting pads and conductive patterns are formed in regions other than the region where the sealing resin is formed. Therefore, the invention can be applied thereto.

Further, the invention can be applied to various electro-optical devices, such as a plasma display device, a field emission display (FED) device, a light emitting diode (LED) display device, an electrophoresis display device, a thin cathode-ray tube, a small television using a liquid crystal shutter, and devices using a digital micromirror device (DMD), in addition to the electro-optical devices described in the above-mentioned embodiments.

The above-mentioned electro-optical device can be used as a display unit of various electronic apparatuses, such as a cellular phone and a mobile computer.

What is claimed is:

1. A mounting structure comprising:
a mounting substrate includes;
a conductive pattern formed over the mounting substrate and extending in a Y direction, the conductive pattern having mounting pads arranged in an X direction, the X direction and the Y direction being two directions orthogonal to each other; and
a mounted member mounted on the mounting substrate so as to be electrically connected to the mounting pads, wherein a first conductive layer, an insulating layer, a second conductive layer, and a third conductive layer are formed on the mounting substrate in this order from a lower side to an upper side of the mounting substrate, and
each conductive pattern includes:
the mounting pad formed by stacking the first conductive layer, the insulating layer, and the third conductive layer, which is an outermost layer, in this order;
a test pad that is positioned adjacent to a region where the mounting pad is formed, outside a region where the mounted member is mounted, and formed by stacking the first conductive layer, the insulating layer, and the third conductive layer, which is the outermost layer, in this order; and
a lead portion that extends from the test pad and formed by stacking the first conductive layer and the insulating layer, which is an outermost layer.

2. The mounting structure according to claim 1, wherein signal line portions formed by stacking the first conductive layer, the insulating layer, and the second conductive layer, which is an outermost layer, in this order extend from the lead portions, respectively.

3. The mounting structure according to claim 2, wherein the signal line portions are coated with a covering member for partially covering the mounting substrate, and the mounting pads, the test pads, and the lead portions are arranged in a region protruding from the covering member of the mounting substrate.

4. The mounting structure according to claim 1, wherein the insulating layer is selectively formed on only the first conductive layer.

5. The mounting structure according to claim 4, wherein the first conductive layer is made of Ta or Ta alloy, and the insulating layer is made of $TaO_x$, and the second conductive layer is made of Cr or Cr alloy, and the third conductive layer is made of indium tin oxide (ITO).

6. The mounting structure according to claim 1, wherein the insulating layer is provided with removed portions for electrically connecting the third conductive layer of the mounting pads and the test pads to the first conductive layer.

7. The mounting structure according to claim 1, wherein, in the mounting pad, the second conductive layer is formed between the insulating layer and the third conductive layer.

8. The mounting structure according to claim 1, wherein, in the test pad, the second conductive layer is formed between the insulating layer and the third conductive layer.

9. The mounting structure according to claim 1, wherein the mounted member is an IC.

10. The mounting structure according to claim 9, wherein the mounting pads are output pads for outputting signals from the IC.

11. An electro-optical device comprising the mounting structure according to claim 1, wherein the mounting substrate is an electro-optical device substrate having an electro-optical material in a region in which a plurality of pixels are arranged in a matrix, and the plurality of conductive patterns are pixel driving signal lines extending from a mounting region of the member to the region in which the electro-optical material is held.

12. The electro-optical device according to claim 11, wherein, in the electro-optical device substrate, each of the plurality of pixels is provided with a pixel switching thin film diode having a three-layered structure of the first conductive layer, the insulating layer, and the second conductive layer and a pixel electrode composed of the third conductive layer that is electrically connected to the signal line portion through the thin film diode.

13. The electro-optical device according to claim 11, wherein, in the electro-optical device substrate, a resin layer is formed at least along an outer periphery of the region in which the electro-optical material is held, and the signal line portions are formed at the inside of a region in which the resin layer is formed, and the lead portions, the test pads, and the mounting pads are formed at the outside of the region in which the resin layer is formed.

14. An electro-optical device substrate comprising: a conductive pattern formed over the electro-optical device substrate and extending in a Y direction, the conductive pattern having mounting pads arranged in an X direction, the X direction and the Y direction being two directions orthogonal to each other; and an electro-optical material held in a region where a plurality of pixels are arranged in a matrix, wherein a first conductive layer, an insulating layer, a second conductive layer, and a third conductive layer are formed on the electro-optical device substrate in this order from a lower side to an upper side of the electro-optical device substrate, and each signal line includes:
the mounting pad formed by stacking the first conductive layer, the insulating layer, and the third conductive layer, which is an outermost layer, in this order;

a test pad that is positioned adjacent to a region where the mounting pad is formed, outside a region where an IC or flexible substrate is mounted, and formed by stacking the first conductive layer, the insulating layer, and the third conductive layer, which is the outermost layer, in this order; and a lead portion that extends from the test pad, and formed by stacking the first conductive layer and the insulating layer, which is an outermost layer.

15. A mounting structure comprising:
a mounting substrate includes;
a conductive pattern formed over the mounting substrate and extending in a Y direction, the conductive pattern having mounting pads arranged in an X direction, the X direction and the Y direction being two directions orthogonal to each other; and a mounted member that is mounted on the mounting substrate so as to be electrically connected to the mounting pads, wherein each conductive pattern includes:
the mounting pad formed by stacking a first conductive layer, an insulating layer, and an ITO layer, which is an outermost layer, in this order;

a test pad that is positioned adjacent to a region where the mounting pad is formed, outside a region where the mounted member is mounted, and formed by stacking the first conductive layer, the insulating layer, and the ITO layer, which is the outermost layer, in this order; and a lead portion that extends from the test pad, and formed by stacking the first conductive layer and the insulating layer, which is an outermost layer.

16. The mounting structure according to claim 15, wherein signal line portions formed by stacking the first conductive layer, the insulating layer, and a second conductive layer, which is an outermost layer, in this order extend from the lead portions, respectively.

17. The mounting structure according to claim 15, wherein the insulating layer is provided with removed portions for electrically connecting the ITO layer of the mounting pads and the test pads to the first conductive layer.

18. The mounting structure according to claim 15, wherein, in the mounting pad, the second conductive layer is formed between the insulating layer and the ITO layer.

19. The mounting structure according to claim 15, wherein, in the test pad, the second conductive layer is formed between the insulating layer and the ITO layer.

20. An electro-optical device comprising the mounting structure according to claim 15,
   wherein the mounting substrate is an electro-optical device substrate having an electro-optical material in a region in which a plurality of pixels are arranged in a matrix, and
   the plurality of conductive patterns are pixel driving signal lines extending from a mounting region of the member to the region in which the electro-optical material is held.

21. An electro-optical device substrate comprising:
   a conductive pattern formed over the electro-optical device substrate and extending in a Y direction, the conductive pattern having mounting pads arranged in an X direction, the X direction and the Y direction being two directions orthogonal to each other; and
   an electro-optical material held in a region where a plurality of pixels are arranged in a matrix,
   wherein each signal line includes:
      the mounting pad formed by stacking a first conductive layer, an insulating layer, and an ITO layer, which is an outermost layer, in this order;
      a test pad that is positioned adjacent to a region where the mounting pad is formed, outside a region where an IC or flexible substrate is mounted, and formed by stacking the first conductive layer, the insulating layer, and the ITO layer, which is the outermost layer, in this order; and
      a lead portion that extends from the test pad, and formed by stacking the first conductive layer and the insulating layer, which is an outermost layer.

22. An electro-optical device substrate comprising:
   a conductive pattern formed over the electro-optical device substrate and extending in a Y direction, the conductive pattern having mounting pads arranged in an X direction, the X direction and the Y direction being two directions orthogonal to each other; and
   an electro-optical material held in a region where a plurality of pixels are arranged in a matrix,
   wherein a first conductive layer, an insulating layer, and pixel electrodes are formed on the electro-optical device substrate, and
   each signal line includes:
      the mounting pad that formed by stacking the first conductive layer, the insulating layer, and a layer simultaneously formed with the pixel electrodes, which is an outermost layer, in this order;
      a test pad that is positioned adjacent to a region where the mounting pad is formed, outside a region where an IC or flexible substrate is mounted, and formed by stacking the first conductive layer, the insulating layer, and the layer simultaneously formed with the pixel electrodes, which is the outermost layer, in this order; and
      a lead portion that extends from the test pad, and formed by stacking the first conductive layer and the insulating layer, which is an outermost layer.

23. An electronic apparatus comprising the electro-optical device according to claim 11.

* * * * *